(12) United States Patent
Shin et al.

(10) Patent No.: US 8,513,671 B2
(45) Date of Patent: Aug. 20, 2013

(54) DISPLAY DEVICE AND METHOD OF MANUFACTURING THE SAME

(75) Inventors: Min-Chul Shin, Yongin (KR); Kyu-Sik Cho, Yongin (KR); Won-Kyu Lee, Yongin (KR); Tae-Hoon Yang, Yongin (KR); Byoung-Kwon Choo, Yongin (KR); Yun-Gyu Lee, Yongin (KR); Yong-Hwan Park, Yongin (KR); Sang-Ho Moon, Yongin (KR); Bo-Kyung Choi, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 206 days.

(21) Appl. No.: 13/114,585

(22) Filed: May 24, 2011

(65) Prior Publication Data

US 2011/0291122 A1 Dec. 1, 2011

(30) Foreign Application Priority Data

May 26, 2010 (KR) .................. 10-2010-0049334

(51) Int. Cl.
*H01L 27/14* (2006.01)

(52) U.S. Cl.
USPC .............................. 257/72; 257/59

(58) Field of Classification Search
USPC ........................................ 257/72, 59
See application file for complete search history.

(56) References Cited

FOREIGN PATENT DOCUMENTS

| JP | 2001-282701 | 10/2001 |
|---|---|---|
| JP | 2006-313363 | 11/2006 |
| KR | 1020010066393 | 7/2001 |
| KR | 10-2002-0080201 | 10/2002 |
| KR | 1020080000251 | 1/2008 |
| KR | 1020080010865 | 1/2008 |
| KR | 10-2010-0019019 | 2/2010 |

*Primary Examiner* — Douglas Menz
(74) *Attorney, Agent, or Firm* — H.C. Park & Associates, PLC

(57) ABSTRACT

A display device with the substrate divided into three areas. A semiconductor layer is formed in the first second areas and includes a channel area and source/drain areas; a gate insulating layer formed on the semiconductor layer in an area corresponding to the channel area; and a gate electrode formed on the gate insulating layer. The source/drain electrodes contact the source/drain areas, respectively; a pixel electrode is formed in the same layer but in a third area; an interlayer insulating layer is formed on a whole surface of the substrate including the formed structures; and a gate line is formed on the interlayer insulating layer and is electrically connected to a gate electrode of the first area through a via contact hole of the interlayer insulating layer.

11 Claims, 23 Drawing Sheets

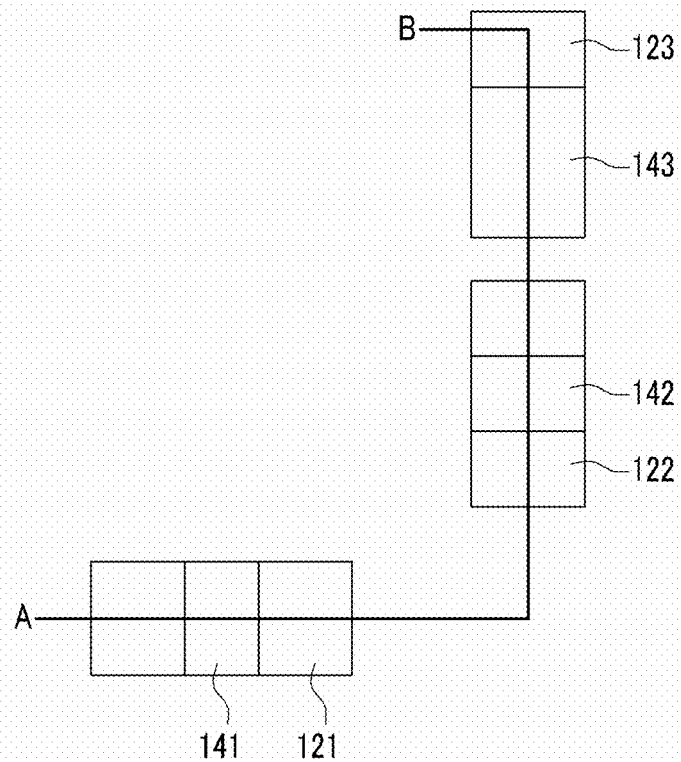

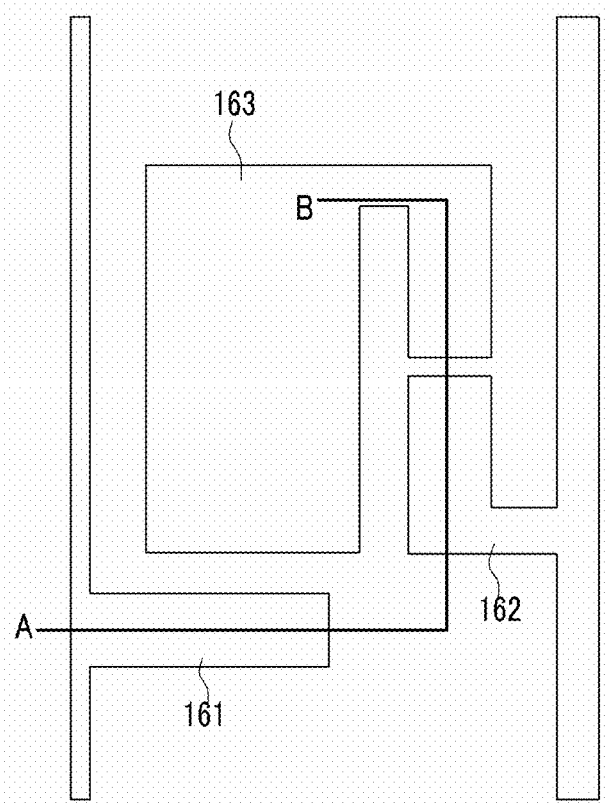

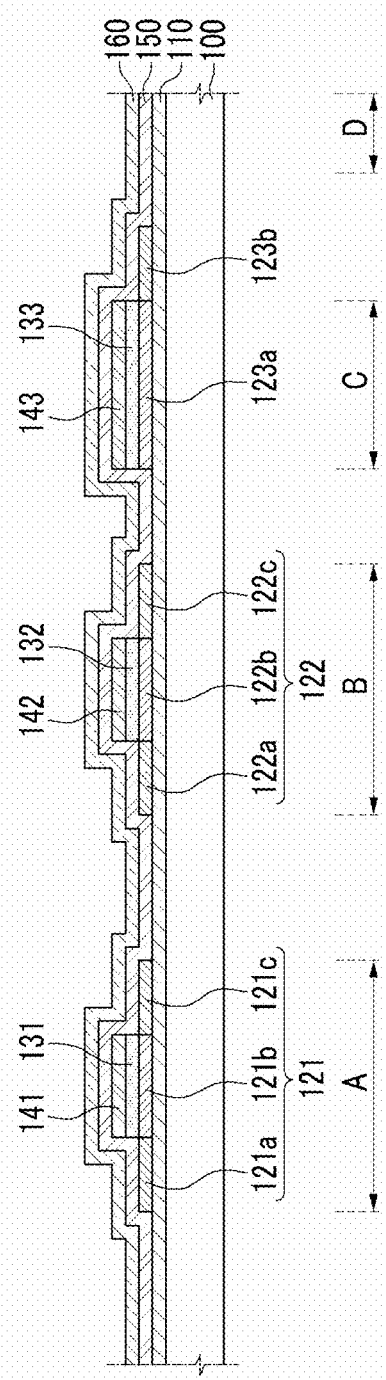

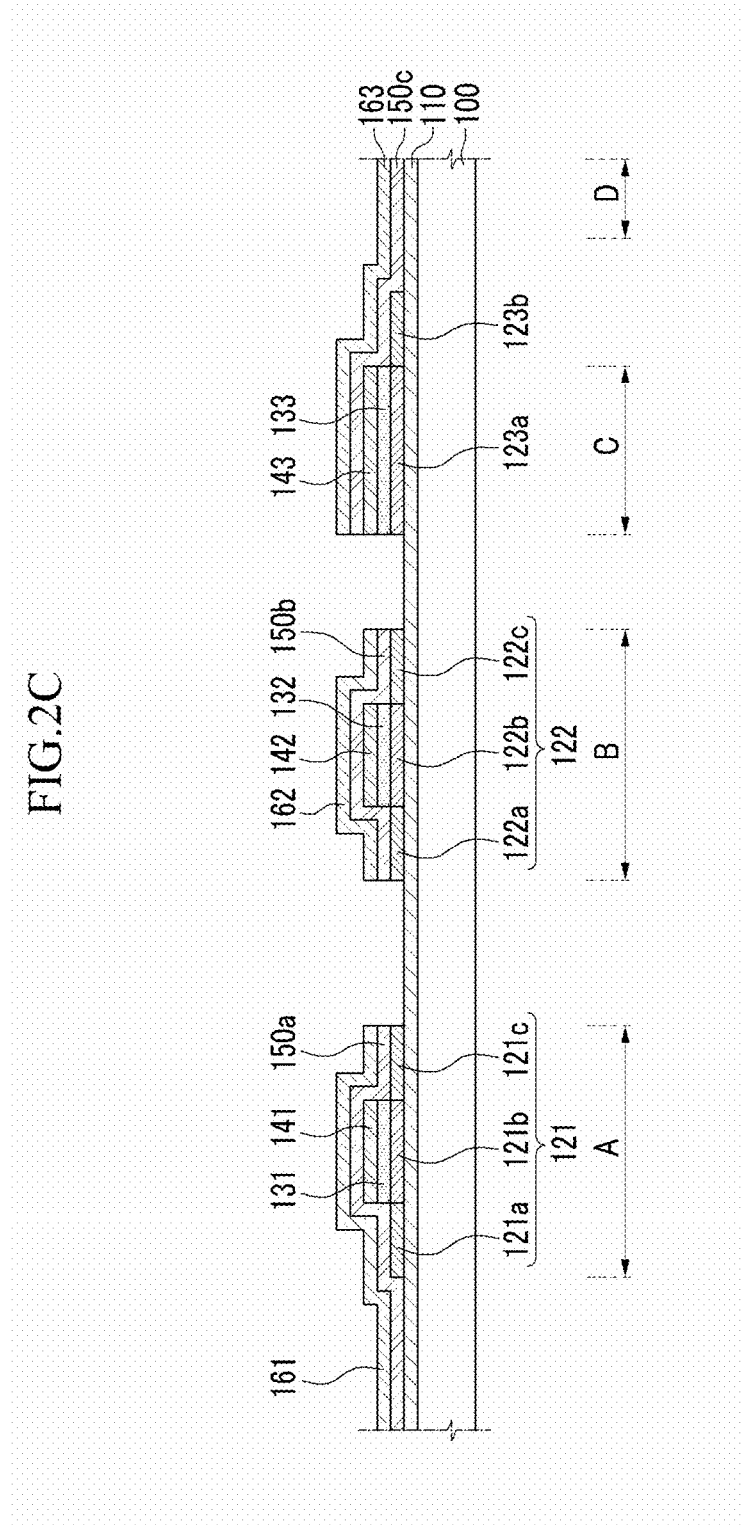

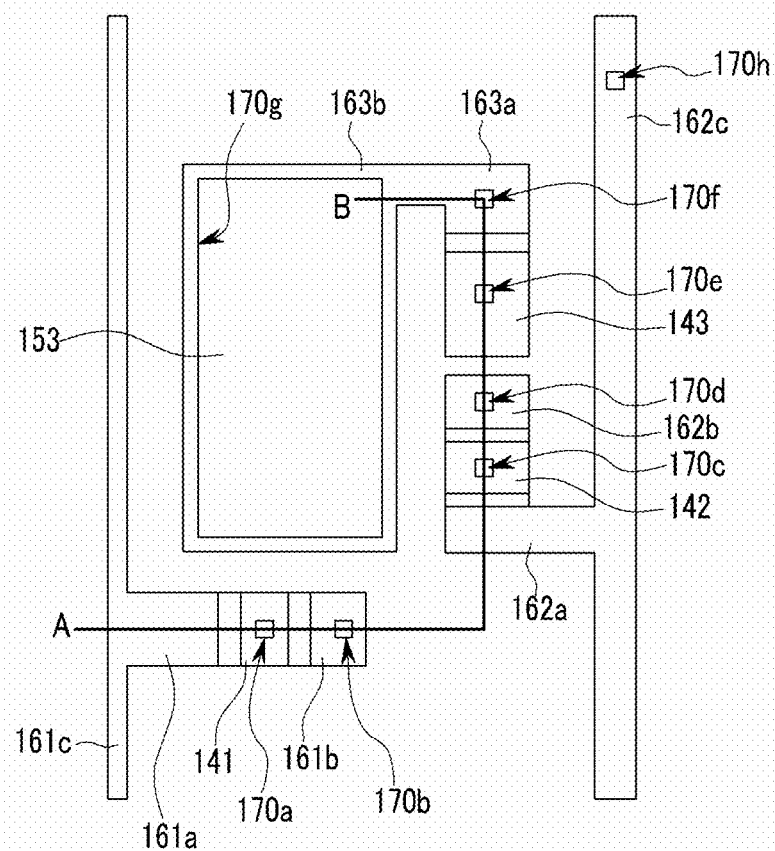

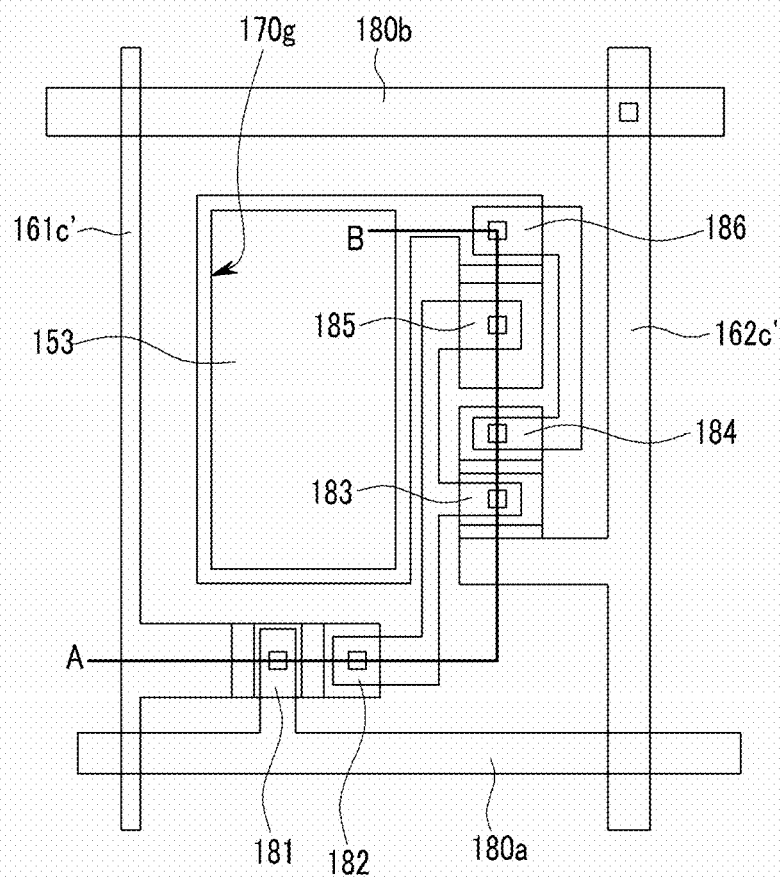

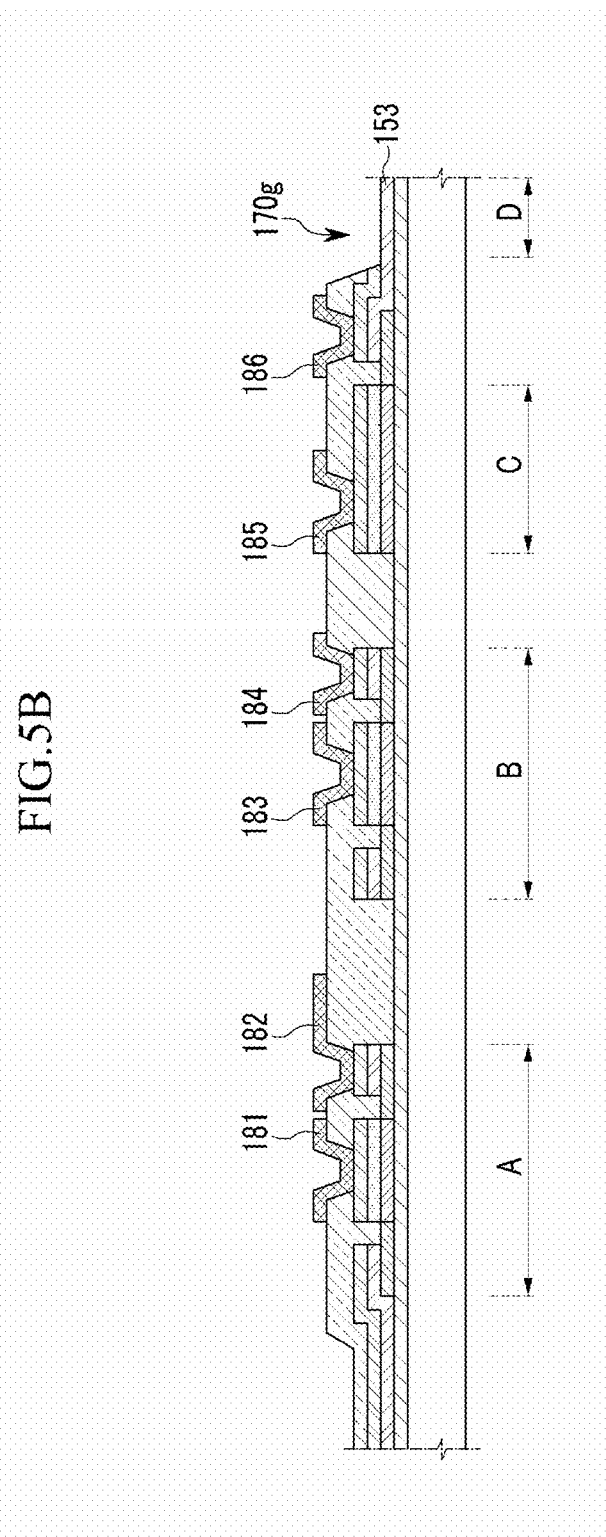

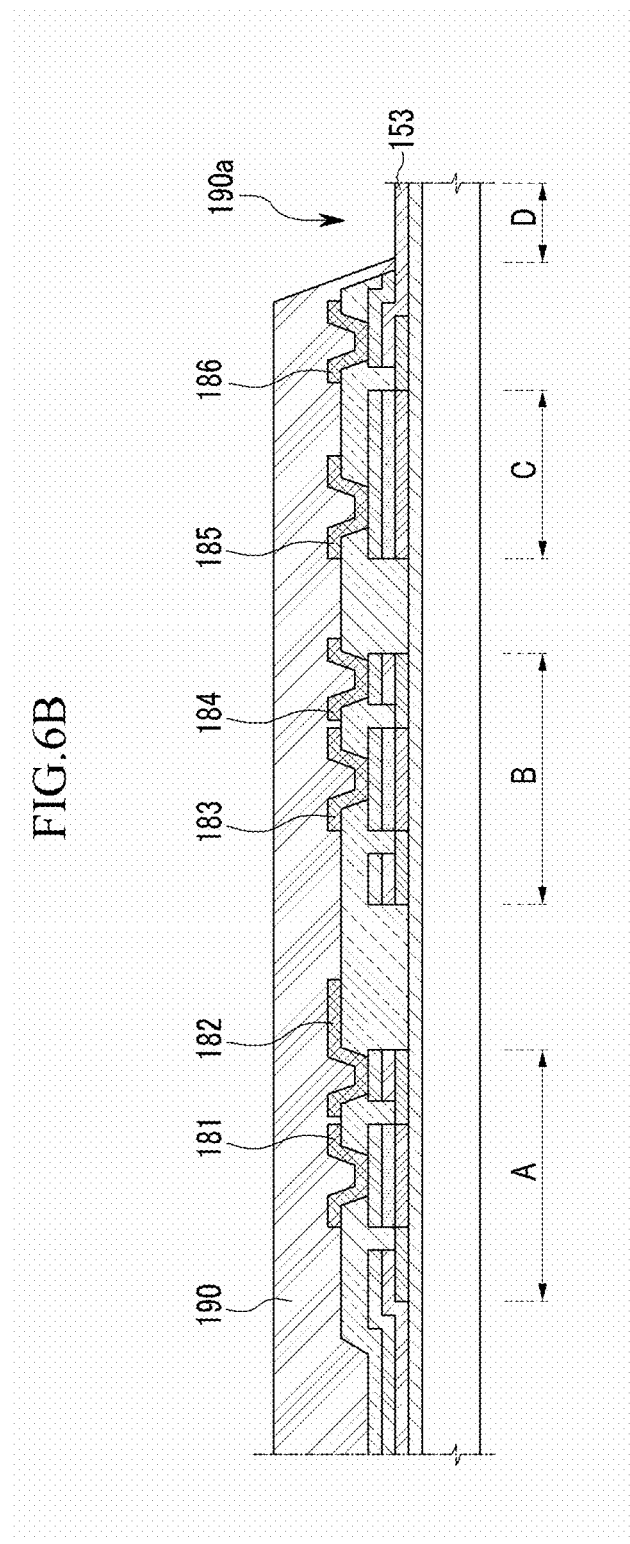

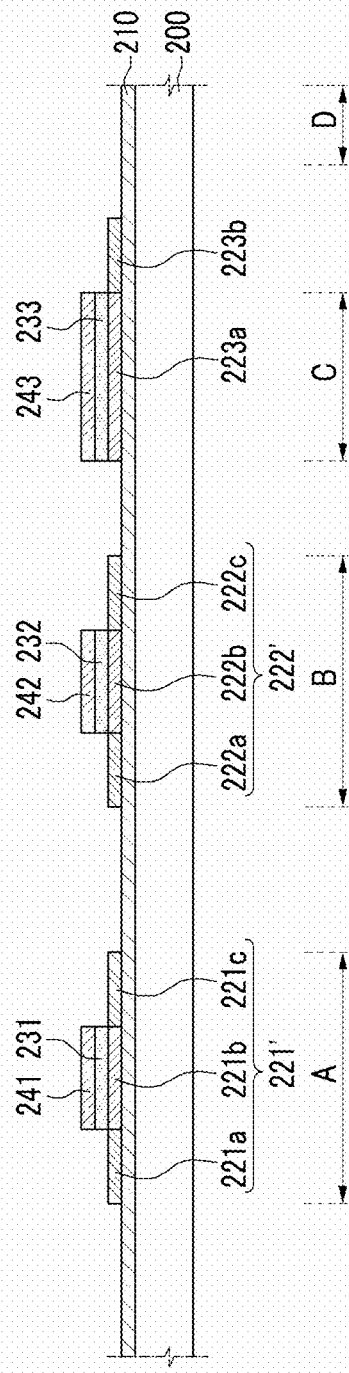

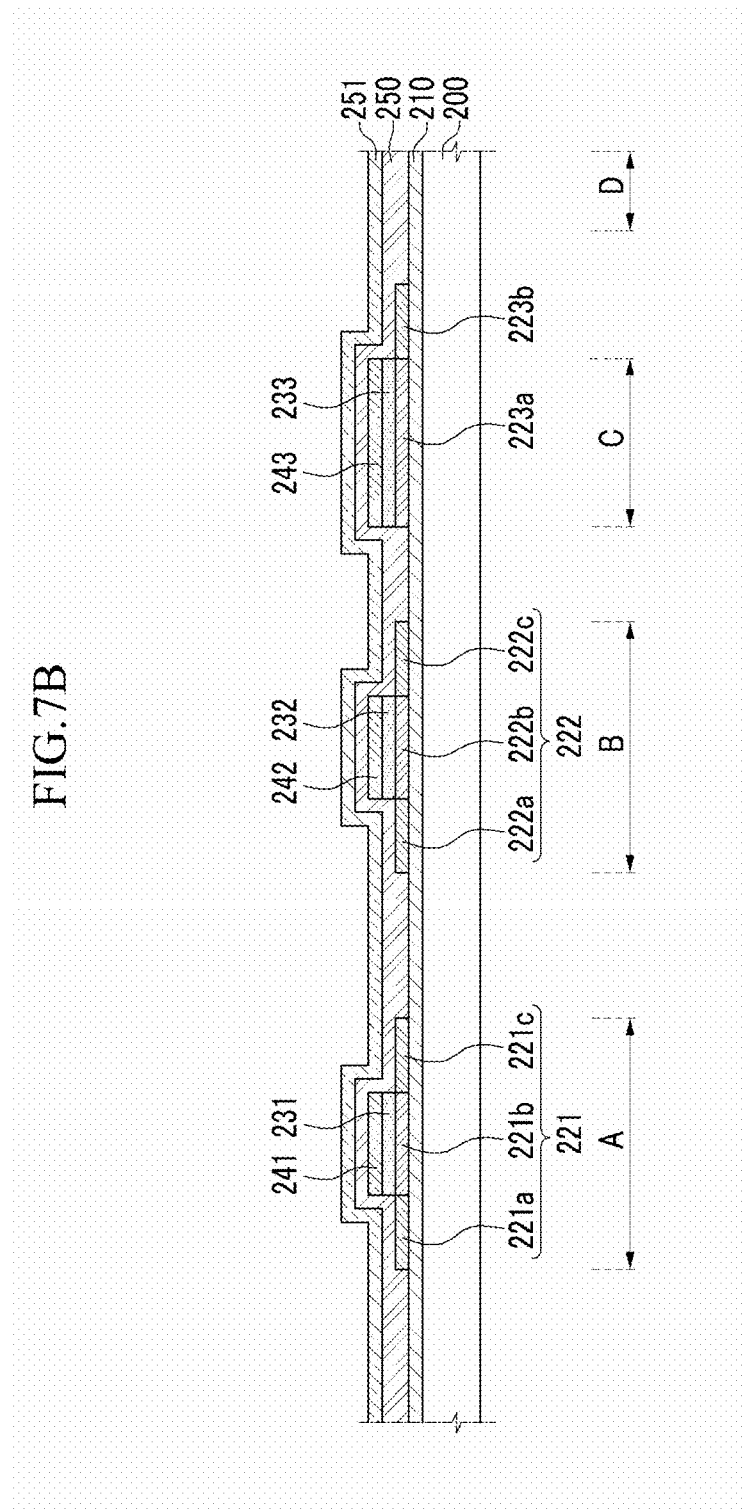

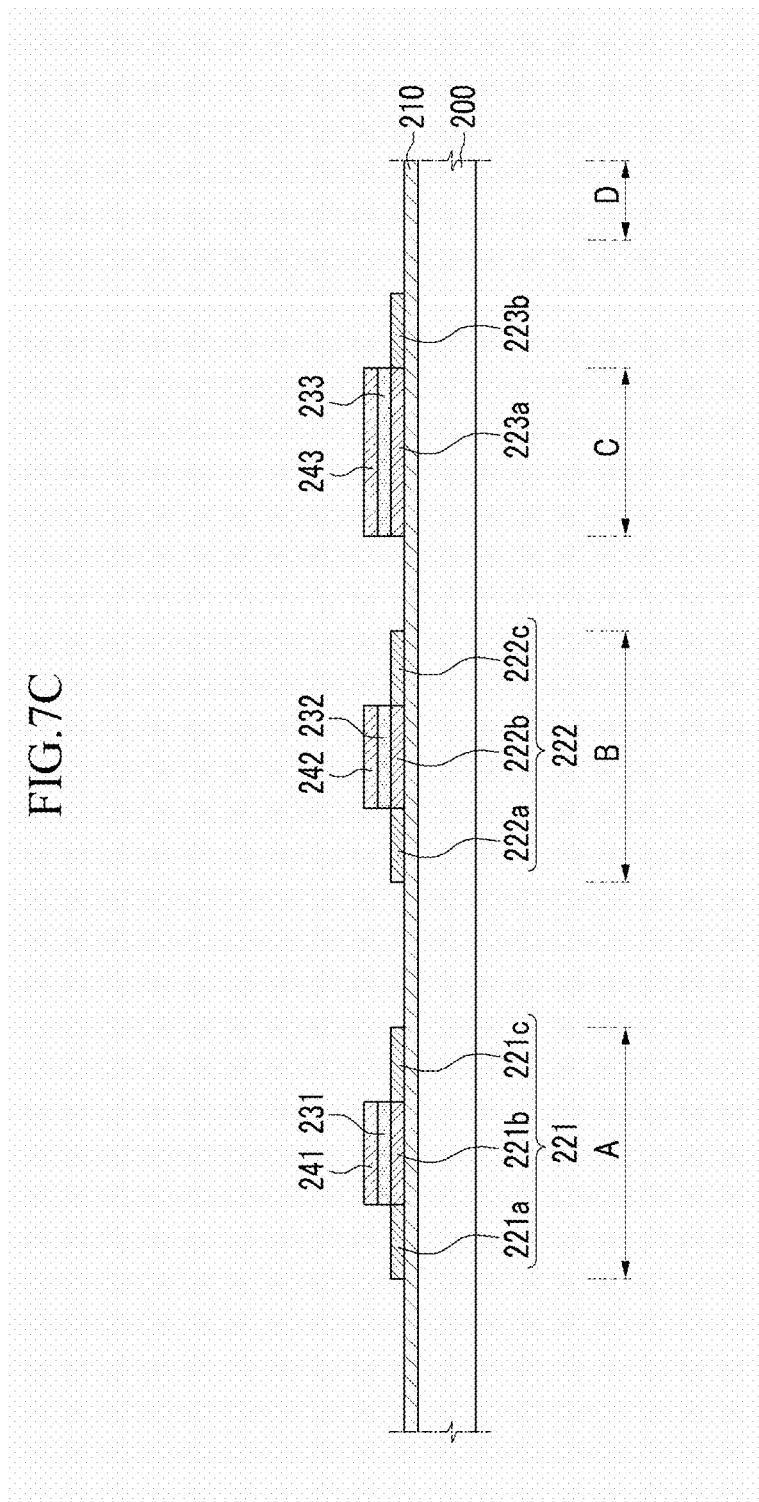

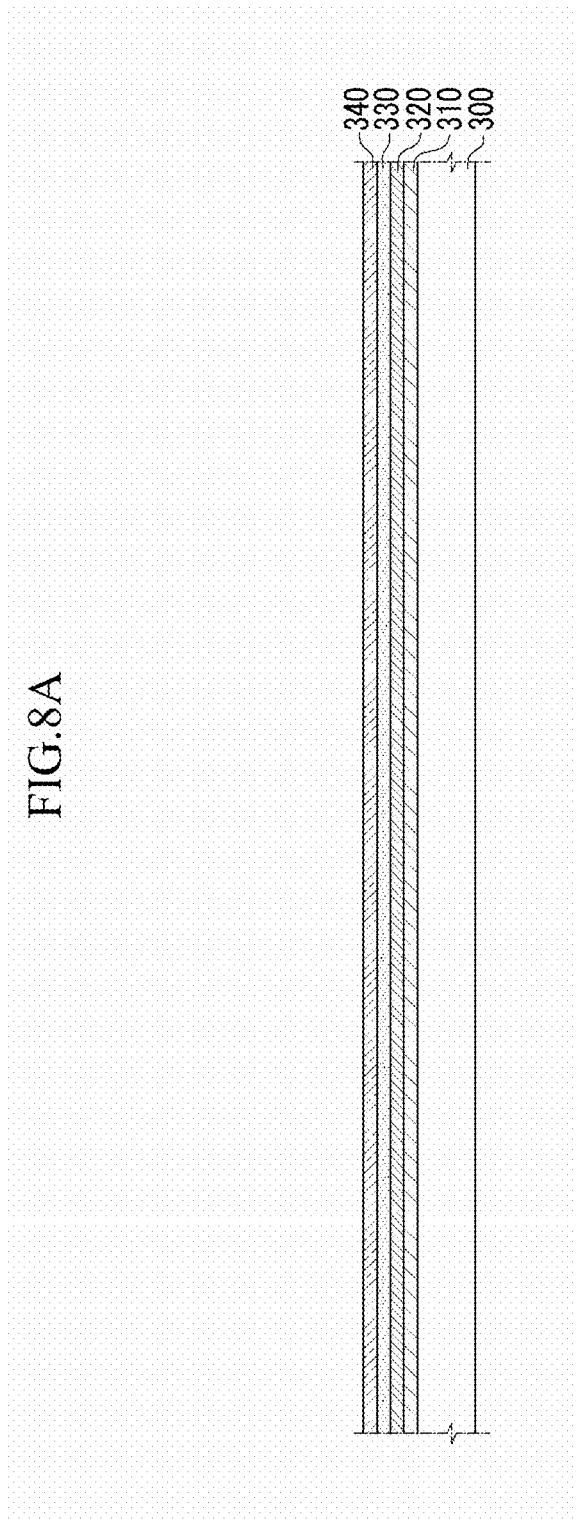

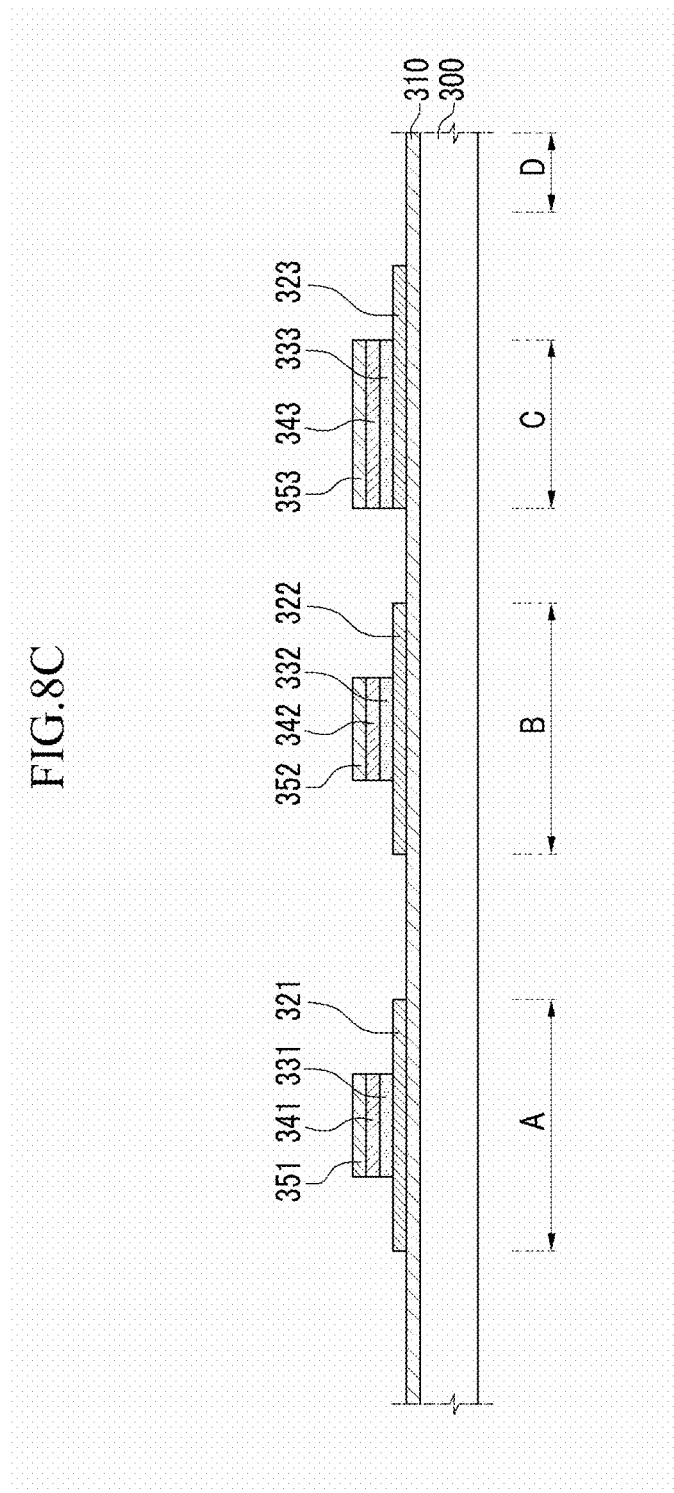

DISPLAY DEVICE AND METHOD OF MANUFACTURING THE SAME

CROSS-REFERENCE TO RELATED APPLICATION

This application claims the benefit of Korean Application No. 10-2010-0049334, filed May 26, 2010 in the Korean Intellectual Property Office, the disclosure of which is incorporated herein by reference.

BACKGROUND

1. Field

Aspects of the described technology relate generally to a display device and a method of manufacturing the same. More particularly, aspects of the described technology relate generally to a display device embodying a low resistance wire.

2. Description of the Related Art

In general, an organic light emitting diode (OLED) display, which is one of the types of display devices, is a self luminescent display that emits light by electrically exciting a fluorescent organic compound. The OLED displays are divided into a passive matrix method and an active matrix method according to a method of driving the pixels that are disposed in a matrix form. An active matrix organic light emitting diode (AMOLED) element has lower power consumption than that of a passive matrix organic light emitting diode (PMOLED) element and has high resolution, and is thus appropriate for displaying over a large area.

Further, OLED displays are divided into a bottom emission type and a top emission type according to the light emission method. The bottom emission method is a method that emits light from an emission layer to the outside through a thin film transistor display panel, and the top emission method is a method that emits light from an emission layer to the outside through a common electrode. Because the aperture ratio is not influenced by a signal line and a thin film transistor, the top emission method, is advantageous.

As the sizes of television screens increase, it is necessary to use a low resistance wire as a wire of a thin film transistor that is used for the AMOLED element. However, because resistance of a wire increases by a heat treatment process for crystallization or activation in an existing low-temperature poly-Si (LTPS) process or heat crystallization process, it is difficult to embody a low resistance wire, and when further using a mask in order to avoid such a problem, there is a problem that process cost increases.

The above information disclosed in this Background section is only for enhancement of understanding of the background of the described technology and therefore it may contain information that does not form the prior art that is already known in this country to a person of ordinary skill in the art.

SUMMARY

Aspects of the described technology have been made in an effort to provide a display device and a method of manufacturing the same having advantages of embodying a low resistance wire without increasing process cost.

An exemplary embodiment provides a display device including: a substrate that includes a first area, a second area, and a third area; semiconductor layers that are formed on the first area and the second area of the substrate and that include in each area a channel area and source/drain areas; gate insulating layers that are formed on the semiconductor layers and that are formed in areas corresponding to the channel areas; a gate electrode that is formed on each gate insulating layer; source/drain electrodes that contact the source/drain areas, respectively, of the semiconductor layers; a pixel electrode that is formed in the same layer as that of the source/drain electrodes and that is formed in the third area; an interlayer insulating layer that is formed on the whole surface of the substrate including the source/drain electrodes and the pixel electrode; and a gate line that is formed on the interlayer insulating layer and that is electrically connected to the gate electrode of the first area through a via contact hole of the interlayer insulating layer.

The source/drain electrodes may be formed in a stacked structure of a transparent conductive layer and a metal layer.

The pixel electrode may be formed with a transparent conductive layer.

The gate electrodes may be formed with a doped amorphous silicon layer or a doped polysilicon layer.

The display device may further include a first connection wire that is formed on the interlayer insulating layer and that is electrically connected to the gate electrode of the first area through a via contact hole of the interlayer insulating layer.

The display device may further include a data line and a power supply line that are formed in the same layer as that of the source/drain electrodes.

The display device may further include a second connection wire that is electrically connected to a drain electrode of the first area, a third connection wire that is electrically connected to a gate electrode of the second area, and a fourth connection wire that is electrically connected to a drain electrode of the second area, and that are formed on the interlayer insulating layer.

Another embodiment provides a method of manufacturing a display device, the method including: providing a substrate including a first area, a second area, and a third area; forming a semiconductor layer including a channel area and source/drain areas in each of the first area and the second area of the substrate; forming gate insulating layers on the semiconductor layers and in an area corresponding to each channel area; forming a gate electrode on each gate insulating layer; forming source/drain electrodes directly contacting source/drain areas, respectively, of the semiconductor layer; forming a pixel electrode in the same layer as that of the source/drain electrodes and in the third area; forming an interlayer insulating layer on the whole surface of the substrate including the source/drain electrodes and the pixel electrode; and forming a gate line on the interlayer insulating layer and that is electrically connected to the gate electrode of the first area through a via contact hole of the interlayer insulating layer.

The forming of source/drain electrodes directly contacting source/drain areas, respectively, of the semiconductor layer, and the forming of a pixel electrode in the same layer as that of the source/drain electrodes and in the third area, may include forming a transparent conductive layer and a metal layer on the whole surface of the substrate including the gate electrode; and patterning the transparent conductive layer and the metal layer using a photolithography process.

The photolithography process may use a halftone mask, and the halftone mask may include a light shielding area, a transflective area, and a transmission area, wherein the light shielding area may correspond to the source/drain electrode area and the transflective area may correspond to the pixel electrode area.

The source/drain electrodes may be formed in a stacked structure of a transparent conductive layer and a metal layer, and the pixel electrode may be formed with a transparent conductive layer.

The gate electrode may be formed with a doped amorphous silicon layer or a doped polysilicon layer.

A display device according to aspects of the present invention can reduce the process cost by reducing the number of mask processes while embodying a low resistance wire.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIGS. 1 through 6 are views illustrating a method of manufacturing a display device according to an exemplary embodiment;

FIGS. 7A through 7C are cross-sectional views illustrating a method of manufacturing a display device according to another exemplary embodiment; and FIGS. 8A through 8F are cross-sectional views illustrating a method of manufacturing a display device according to another exemplary embodiment.

DETAILED DESCRIPTION

Figure 1B:
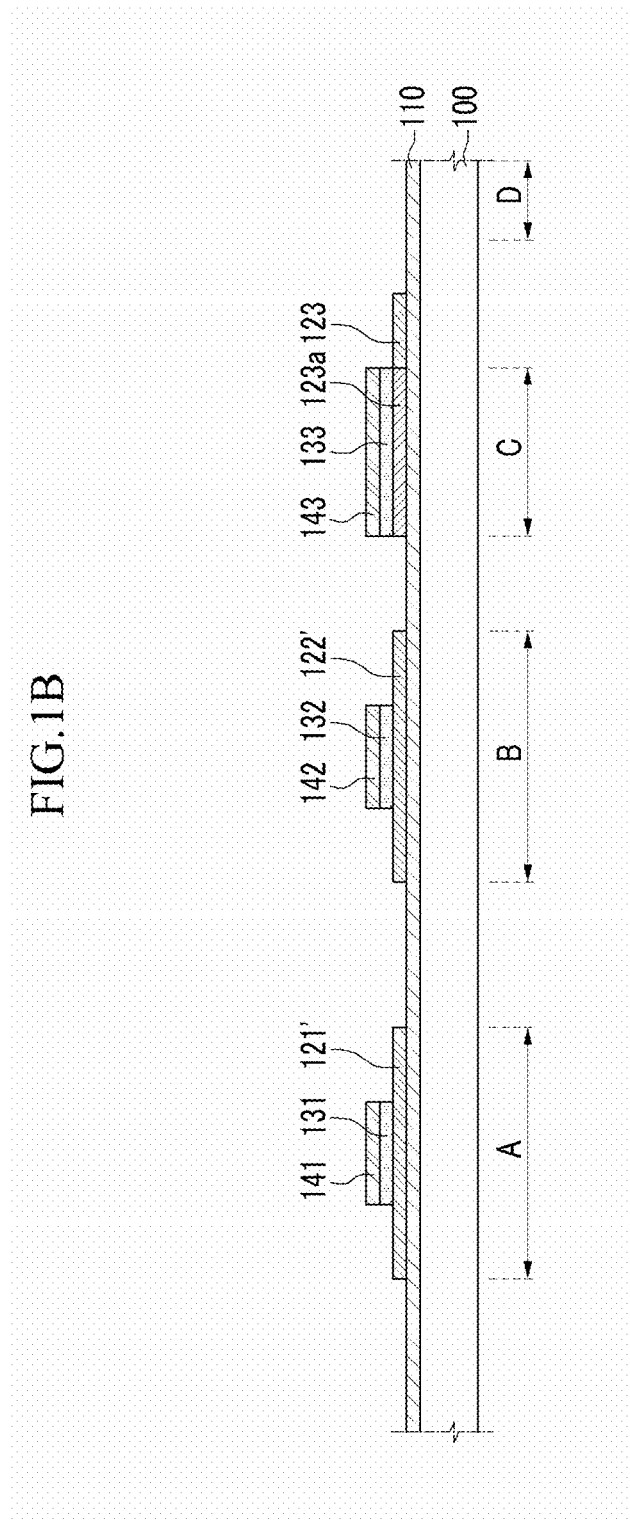

Reference will now be made in detail to the present embodiments of the present invention, examples of which are illustrated in the accompanying drawings, wherein like reference numerals refer to the like elements throughout. The embodiments are described below in order to explain the present invention by referring to the figures. Moreover, it is to be understood that where it is stated herein that one layer is "formed on" or "disposed on" a second layer, the first layer may be formed or disposed directly on the second layer or there may be an intervening layer between the first layer and the second layer. Further, as used herein, the terms "formed on" and the like may be used with the same meaning as "located on" or "disposed on" and are not meant to be limiting regarding any particular fabrication process.

Further, in the exemplary embodiments, like reference numerals designate like constituent elements having the same configuration. Otherwise, configurations different among the exemplary embodiments will be specifically described. Accordingly, the drawings and description are to be regarded as illustrative in nature and not restrictive.

Further, in the drawings, the size and thickness of each element are randomly represented for better understanding and ease of description, and the aspects of the present invention are not limited thereto. In the drawings, the thickness of layers, films, panels, regions, etc., are exaggerated for clarity. In the drawings, for better understanding and ease of description, thicknesses of some layers and areas are exaggeratedly displayed.

In addition, in the entire specification, unless explicitly described to the contrary, the word "comprise" and variations such as "comprises" or "comprising" will be understood to imply the inclusion of stated elements but not the exclusion of any other elements. Further, in the entire specification, a statement regarding an upper part of a target portion indicates an upper part or a lower part of a target portion, and it does not mean that the target portion is always positioned at the upper side based on the gravity direction.

FIGS. 1 through 6 are views illustrating a method of manufacturing a display device according to an exemplary embodiment. In these Figures, FIGS. 1A, 2A, 3A, 4A, 5A and 6A are top plan views of a display device, and FIGS. 1B, 2B, 2C, 3B, 4B, 5B, 6B and 6C each are cross-sectional views taken along the line A-B of the respective FIGS. 1A, 2A, 3A, 4A, 5A and 6A.

First, referring to FIGS. 1A and 1B, a first area A, a second area B, a third area C, and a fourth area D are defined in a transparent insulation substrate 100 that is formed with glass, quartz, sapphire, etc. The first area A is a switching transistor area, the second area B is a thin film transistor area, the third area C is a capacitor area, and the fourth area D is a light emitting area. For better comprehension and ease of description, the substrate is divided into several areas, however division into several areas in the Figures does not have a special meaning.

Next, on the whole surface of the transparent insulation substrate 100, a shock-absorbing layer 110 of a predetermined thickness is formed with silicon oxide ($SiO_x$) by a plasma-enhanced chemical vapor deposition (PECVD) method. In this case, when performing a crystallization process of an amorphous silicon layer that is formed in a subsequent process, the shock-absorbing layer 110 prevents impurities from being diffused into the transparent insulation substrate 100.

Next, an amorphous silicon layer (not shown) of a predetermined thicknesses is deposited on the shock-absorbing layer 110, and the amorphous silicon layer is crystallized using an excimer laser annealing (ELA) method, a sequential lateral solidification (SLS) method, a metal induced crystallization (MIC) method, a metal induced lateral crystallization (MILC) method, or a super grain silicon (SGS) method, thereby forming a polysilicon layer (that is, a semiconductor layer, not shown).

Next, a gate insulating layer material layer (not shown) of a predetermined thickness is formed on the entire surface including the polysilicon layer. The gate insulating layer material is formed with silicon oxide ($SiO_x$), silicon nitride, or a stacked structure thereof.

Next, a gate electrode material layer (not shown) is formed on the gate insulating layer material layer (not shown). In this case, the gate electrode material layer is formed with an amorphous silicon layer or polysilicon layer. The gate electrode material layer can be formed by directly depositing doped amorphous silicon through performing a doping process while forming the amorphous silicon layer, but as described later, doping can be performed by a doping process for injecting impurities into source/drain areas, and thus undoped amorphous silicon may be used for forming the gate electrode material layer.

Next, the polysilicon layer (not shown), the gate insulating layer material layer (not shown), and the gate electrode material layer (not shown) are patterned by a photolithography process. By patterning, a first polysilicon pattern 121', a first gate insulating layer 131, and a first gate electrode 141 are formed in the first area A, a second polysilicon pattern 122', a second gate insulating layer 132, and a second gate electrode 142 are formed in the second area B, and a third polysilicon pattern 123, a capacitor lower electrode 123a, a dielectric layer 133, and a capacitor upper electrode 143 are formed in the third area C.

In these cases, the photolithography process can be performed using a halftone mask (or slit mask), and for example, a halftone mask that is divided into a light shielding area, a transflective area, and a transmission area.

The light shielding area is an area that does not transmit light and corresponds to the first gate electrode 141 area, the second gate electrode 142 area, and the capacitor upper electrode 143 area. The transflective area is an area that transmits a predetermined portion of light and corresponds to the first polysilicon pattern 121' area, the second polysilicon pattern 122' area, and the capacitor lower electrode 123a area. The transmission area is an area that transmits all light and corresponds to an area in which all of the gate electrode material layer and the gate insulating layer material layer including the polysilicon layer are removed. A photolithography process using the halftone mask (or a slit mask) is well known to a person of ordinary skill in the art, so a detailed description thereof will be omitted.

As described above, the first and second polysilicon layer patterns 121' and 122' and the gate electrode 141 and 142 layers according to this exemplary embodiment are formed using a first mask. Reference numeral 123b indicates a third polysilicon layer pattern that extends from the capacitor lower electrode 123a to be connected to a pixel electrode to be described later.

Next, referring to FIGS. 2B and 2C, an n-type or p-type impurity is doped at the whole surface of the substrate, including the gate electrodes 141 and 142 and the capacitor upper electrode 143 and source/drain areas 121a, 121c, 122a, and 122c, and channel areas 121b and 122b are defined in the first area A and the second area B, thereby forming semiconductor layers (polysilicon patterns) 121 and 122. It is preferable that phosphorus (P) is used as the n-type impurity and boron (B) is used as the p-type impurity.

In this case, in the channel areas 121b and 122b, ions are intercepted from being injected into the channel areas 121b and 122b by the first gate electrode 141 and the second gate electrode 142, and thus the channel areas 121b and 122b correspond to a non-doping area, and the first gate electrode 141 and the second gate electrode 142 that are formed with an amorphous silicon layer are formed with a polysilicon layer or an amorphous silicon layer that is doped by an impurity doping process. A heat treatment process for activating the doped impurities can be performed.

Still referring to FIGS. 2B and 2C, a transparent conductive layer 150 is formed at the whole surface of the substrate including the gate electrodes 141 and 142 and the capacitor upper electrode 143, and a metal layer 160 is formed on the transparent conductive layer 150.

The transparent conductive layer 150 is made of any one material that is selected from a group consisting of indium tin oxide (ITO), indium zinc oxide (IZO), tin oxide (TO), and zinc oxide (ZnO), and the metal layer 160 is formed in a single layer with a material that is selected from a group consisting of Mo, W, MoW, AlNd, Ti, Cu, a Cu alloy, Al, an Al alloy, Ag, and an Ag alloy, or is formed in one stacked structure that is selected from a group consisting of a two-layered structure and a multi-layered structure of Mo, Cu, Al, or Ag, which is a low resistance material, in order to reduce wire resistance. Reference numeral 123b indicates a doped polysilicon silicon layer pattern that extends from the capacitor lower electrode 123a to be connected to a pixel electrode to be described later. Further, the transparent conductive layer 150 and the metal layer 160 are etched through a second mask, so that the metal layer patterns 161, 162, and 163 of the first area A, the second area B, and the third and fourth area C, D are formed.

Figure 3A:
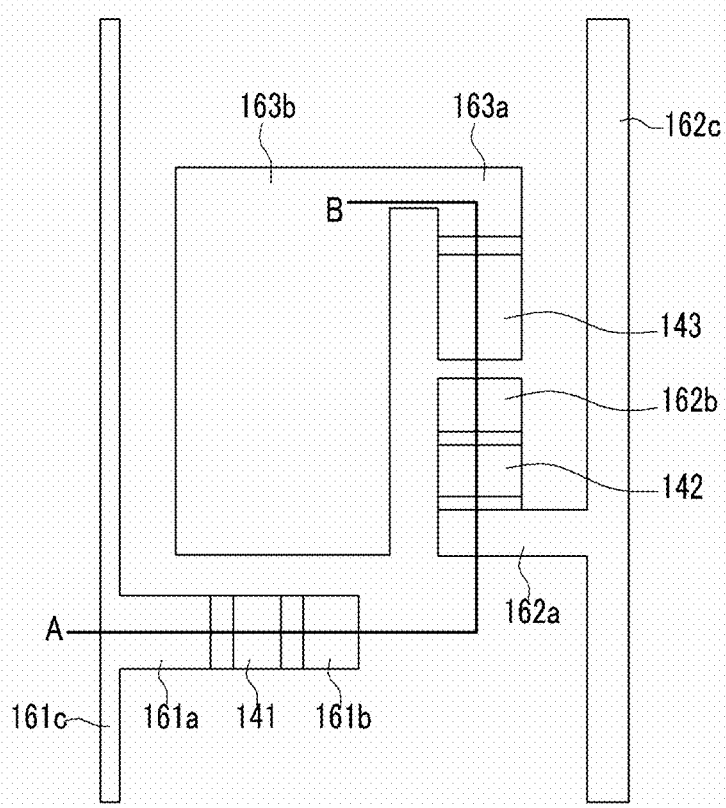
Figure 3B:
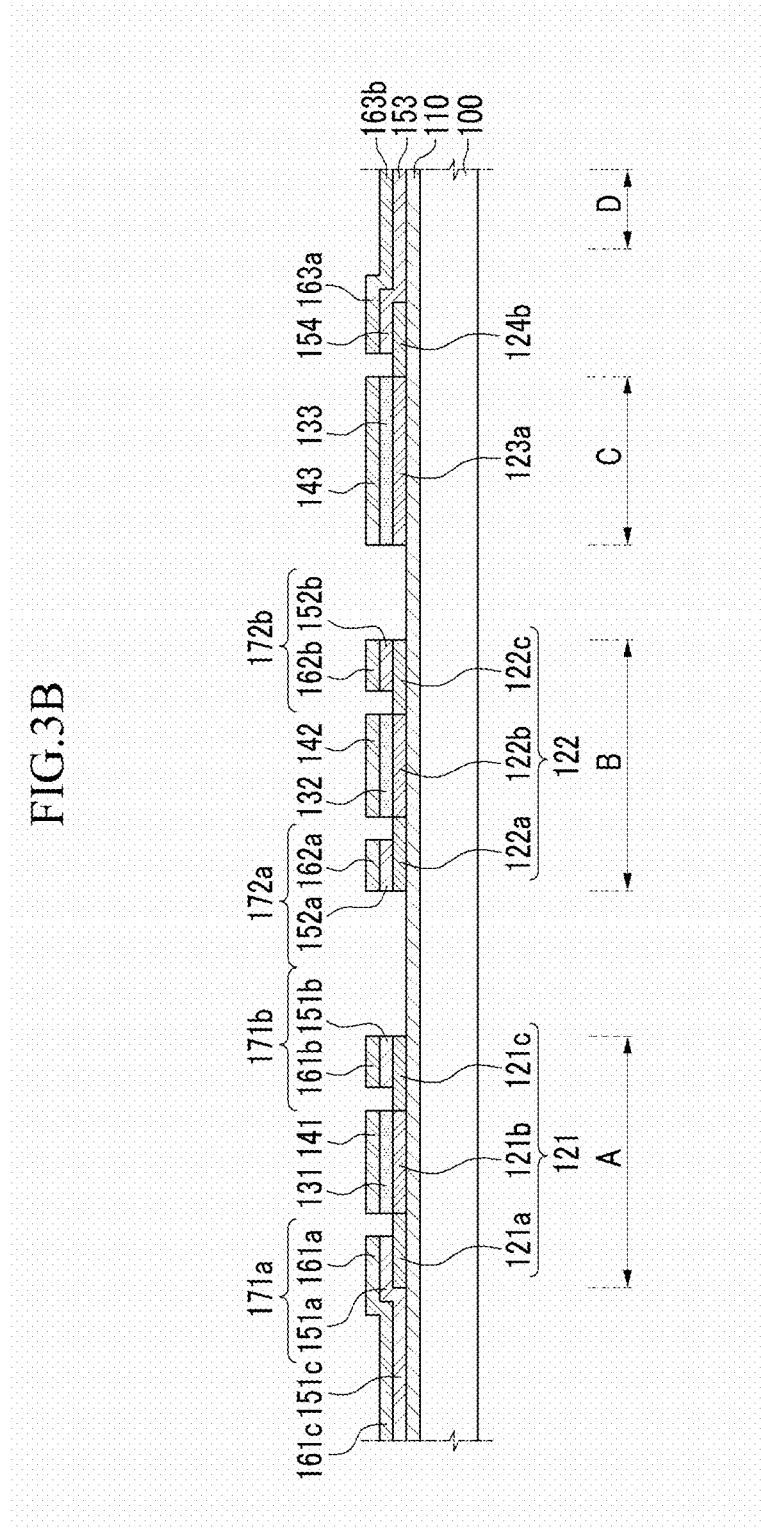

Next, referring to FIGS. 3A and 3B, the transparent conductive layer 150 and the metal layer 160 are patterned by a photolithography process. As described and numbered below, by patterning, source/drain electrodes 171a and 171b that are electrically connected to the source/drain areas 121a and 121c, respectively, are formed in the first area A, and source/drain electrodes 172a and 172b that are electrically connected to the source/drain areas 122a and 122c, respectively, are formed in the second area B.

In this case, the source electrodes 171a and 172a of the first area A and the second area B are formed in a stacked structure of transparent conductive layer patterns 151a and 152a and metal layer patterns 161a and 162a, and the drain electrodes 171b and 172b of the first area A and the second area B are also formed in a stacked structure of transparent conductive layer patterns 151b and 152b and metal layer patterns 161b and 162b.

Further, while forming the source/drain electrodes 171a, 171b, 172a and 172b, a data line 161c' and a power supply line 162c' (see FIGS. 5A and 6A) are simultaneously formed, and in this case, the data line 161c' is formed in a stacked structure of a transparent conductive layer pattern 151c and a metal layer pattern 161c, and the power supply line 162c' is also formed in a stacked structure of a transparent conductive layer pattern (not shown) and a metal layer pattern 162c.

Further, while forming the source/drain electrodes 171a, 171b, 172a and 172b, a pixel electrode is simultaneously formed in the fourth area D. That is, in the fourth area D, the metal layer is removed and only a transparent conductive layer pattern 153 is formed, and thus the transparent conductive layer pattern 153 performs the function of a pixel electrode.

Reference numeral 154 indicates a wire that extends from the pixel electrode 153 to be connected to the capacitor lower electrode 123a, and reference numeral 163a indicates a metal layer pattern that connects the pixel electrode 153 to a drain electrode 172b 122c of the second area B. However, the metal layer pattern 163a may be removed, and thus the pixel electrode 153 may be directly connected to the drain electrode 172b of the second area B. In this case, the photolithography process can be performed using a halftone mask (or a slit mask), and for example a halftone mask that is divided into a light shielding area, a transflective area, and a transmission area.

The light shielding area is an area that does not transmit light and corresponds to source/drain electrodes 171a, 171b, 172a and 172b, a data line 161c', a power supply line 162c' (see FIGS. 5A and 6A) of the first area and the second area, and a metal layer pattern area 163a, the transflective area is an area that transmits light of a predetermined portion and corresponds to a pixel electrode area 153, and the transmission area is an area that transmits all light and corresponds to an area in which both of the transparent conductive layer 150 and the metal layer 160 are removed. A photolithography process using the halftone mask (or a slit mask) is well known to a person of ordinary skill in the art, so a detailed description thereof will be omitted. As described above, source/drain electrodes 171a, 171b, 172a and 172b, a data line 161c', a power supply line 162c' (see FIGS. 5A and 6A), and a pixel electrode according to this exemplary embodiment can be formed using a second mask.

Figure 4B:
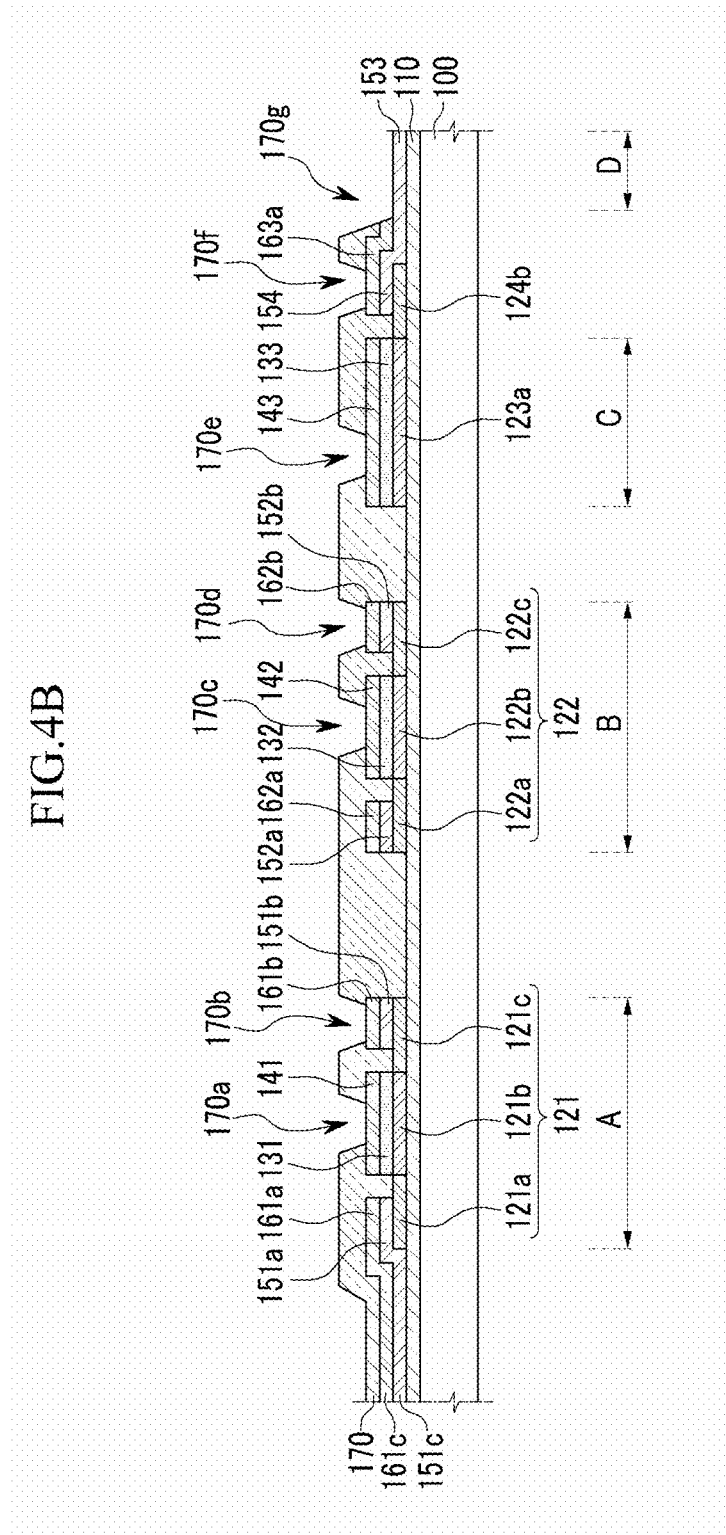

Next, referring to FIGS. 4A and 4B, an interlayer insulating layer 170 (see FIG. 4B) of predetermined thickness is formed on the whole surface of a substrate including the source/drain electrodes 171a, 171b, 172a and 172b, the data line 161c', the power supply line 162c' (see FIGS. 5A and 6A), and the pixel electrode 153. Thereafter, by etching the interlayer insulating layer 170 with a photolithography process, a plurality of via contact holes 170a, 170b, 170c, 170d, 170*e*, 170*f*, 170*g*, and 170*h* are formed. In this case, the plurality of via contact holes is etched using a third mask.

Next, referring to FIGS. 5A and 5B, a metal layer (not shown) is formed on the whole surface of the substrate including the plurality of via contact holes 170*a*, 170*b*, 170*c*, 170*d*, 170*e*, 170*f*, 170*g*, and 170*h* and thereafter, the metal layer is patterned with a photolithography process using a fourth mask. In this case, the metal layer is formed in a single layer with one material that is selected from a group consisting of Mo, W, MoW, AlNd, Ti, Cu, a Cu alloy, Al, an Al alloy, Ag, and a Ag alloy, or is formed in one stacked structure that is selected from a group consisting of a two-layered structure and a multi-layered structure of Mo, Cu, Al, or Ag, which is a low resistance material, in order to reduce wire resistance.

By patterning, in the first area A, a first connection wire 181 that is electrically connected to the first gate electrode 141 is formed, and a second connection wire 182 that is electrically connected to the drain electrode 171 bis formed. Further, in the second area B, a third connection wire 183 that is electrically connected to the second gate electrode 142 is formed, and a fourth connection wire 184 that is electrically connected to the drain electrode 172*b* is formed. Further, in the third area B, a fifth connection wire 185 that is electrically connected to the capacitor upper electrode 143 is formed. Further, a sixth connection wire 186 that is electrically connected to the metal layer pattern 163*a* is formed.

Further, while the connection wires are formed, a gate line 180*a* is simultaneously formed, and an auxiliary power supply line 180*b* is also formed. In this case, the first connection wire 181 is electrically connected to the gate line 180*a*. Further, the second connection wire 182, the third connection wire 183, and the fifth connection wire 185 are connected to each other, and the drain electrode 171*b* of the first area A, the second gate electrode 142 of the second area B, and the capacitor upper electrode 143 are electrically connected.

Further, the fourth connection wire 184 is electrically connected to the sixth connection wire 186, and the drain electrode 172*b* of the second area is electrically connected to the capacitor lower electrode 123*a*. The auxiliary power supply line 180*b* is electrically connected to the power supply line 162*c'* through a via contact hole 170*h*, and the auxiliary power supply line 180*b* may not need to be formed. As described above, by patterning the metal layer 160 with a photolithography process using the fourth mask, a gate line 180*a* and an auxiliary power supply line 180*b* can be formed, and a connection wire (one of 181-186) that connects each element can be formed.

Figure 6A:
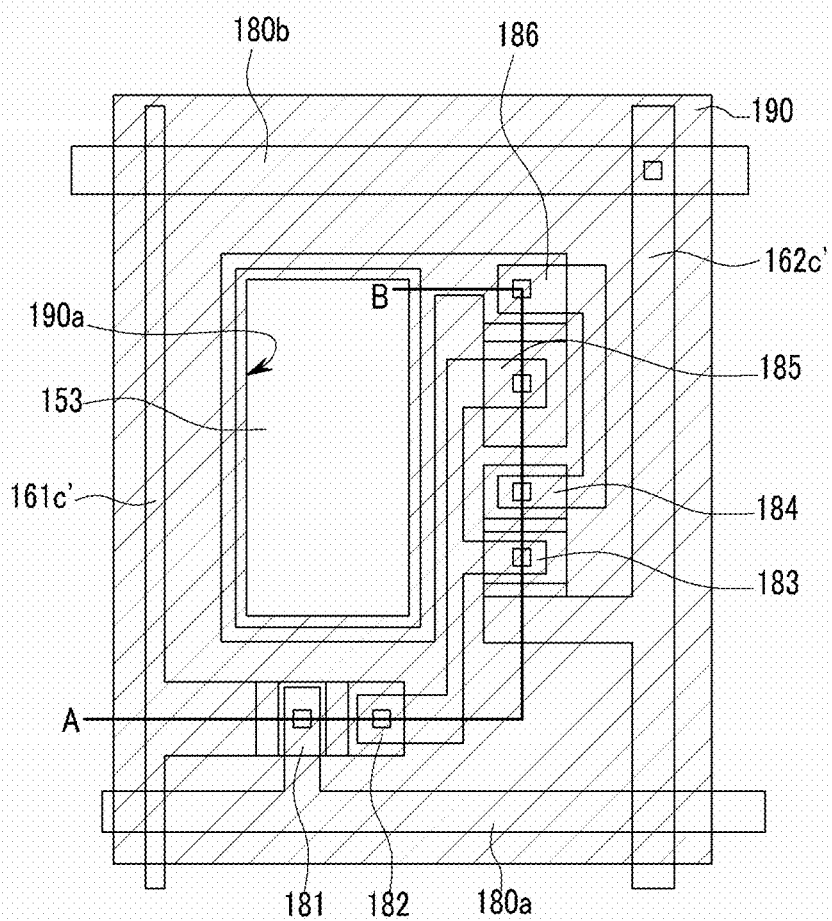

Next, referring to FIGS. 6A and 6B, a pixel defining layer 190 of a predetermined thickness is formed on the whole surface of the substrate including the gate line 180*a*, the auxiliary power supply line 180*b*, and the connection wires 181-186, and an opening 190*a* that exposes a predetermined portion of the pixel electrode 153 is formed using the fifth mask, thereby defining a light emitting area. The pixel defining layer 190 may be made of a kind of material that is selected from a group consisting of a polyimide, a benzocyclobutene series resin, spin-on glass (SOG), and an acrylate.

As described above, according to the present invention, after a heat treatment process for crystallization of an amorphous silicon layer or for activating doped ions is performed, source/drain electrodes 171*a*, 171*b*, 172*a* and 172*b*, the data line 161*c'*, the power supply line 162*c'*, the gate line 180*a*, the auxiliary power supply line 180*b*, and the connection wires 181-186 that electrically connects them can be formed.

That is, conventionally, before a heat treatment process, the gate line 180*a* and the connection wires 181-186 are formed and thus even if a low resistance metal is used as a material of the layers, resistance of the wires increases by the heat treatment process, and therefore it is difficult to embody a low resistance wire. However, in aspects of the present invention, because various wires of a thin film transistor are formed after the heat treatment process, low resistance wires can be embodied.

Further, when embodying the low resistance wires, while source/drain electrodes 171*a*, 171*b*, 172*a* and 172*b* are formed, the pixel electrode 153 is simultaneously formed. Further, when electrically connecting the source/drain electrodes 171*a*, 171*b*, 172*a* and 172*b* to the source/drain areas 121*a*, 121*c*, 122*a* and 122*c*, a via contact hole process, i.e., a process of forming an insulating layer in source/drain areas 121*a*, 121*c*, 122*a* and 122*c* and electrically connecting source/drain electrodes 171*a*, 171*b*, 172*a* and 172*b* after forming via contact holes 170*a* through 170*h* is excluded, and the source/drain electrodes 171*a*, 171*b*, 172*a* and 172*b* are directly electrically connected to the source/drain areas 121*a*, 121*c*, 122*a* and 122*c*, respectively. That is, in the present invention, a process of defining a light emitting area D by forming an opening 190*a* that exposes a predetermined portion of the pixel electrode 153 is completed using only five masks, and therefore, by reducing the number of mask processes while embodying a low resistance wire, the process cost can be reduced.

Figure 6C:
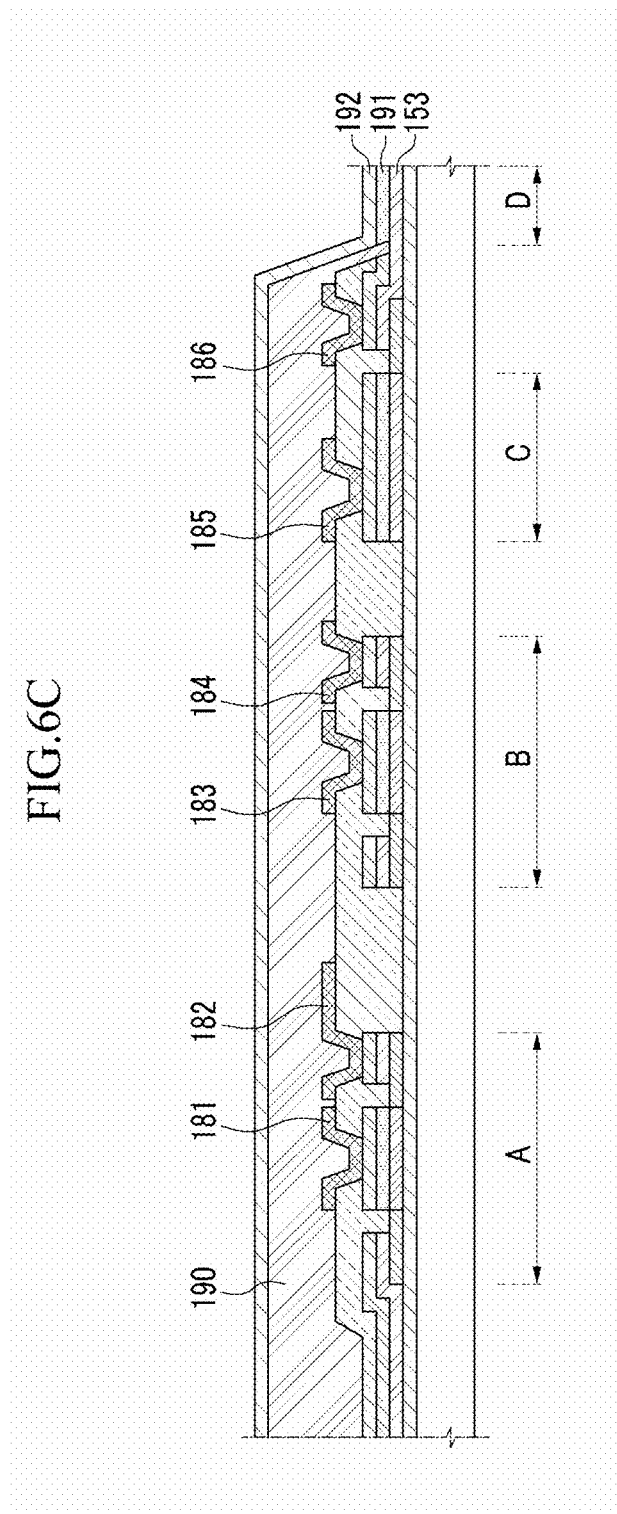

Next, referring to FIG. 6C, an organic film layer 191 is formed on the pixel defining layer 190 including the opening 190*a*. The organic film layer 191 is formed by a low molecule deposition method or a laser thermal transfer method. The organic film layer 191 may be formed with at least one thin film that is selected from an electron injection layer (EIL), an electron transport layer (ETL), a hole injection layer, a hole transport layer, a hole barrier layer, and an organic emission layer.

A hole transport material forming the hole transport layer can be N,N'-di(naphthalene-1-yl)-N,N'-diphenyl-benzidine (a-NPB) or N,N'-bis(3-methylphenyl)-N,N'-diphenyl-[1,1'-biphenyl]-4,4'-diamine (TPD). The film thickness of the hole transport layer can be in a range of about 10 to about 50 nm. When the hole transport layer deviates from the described thickness range, hole injection characteristics deteriorate.

In the hole transport layer, in addition to a hole transport material, a dopant that can emit light for electron-hole coupling can be added. The dopant may be 4-(dicyanomethylene)-2-tert-butyl-6-(1,1,7,7-tetramethyljulolidyl-9-enyl)-4H-pyran (DCJTB), coumarin 6, rubrene, 4-(dicyanomethylene)-2-methyl-6-(4-diemthylaminostyryl)-4H-pyran (DCM), perylene, or quinacridone, and the content thereof may be about 0.1 to about 5 wt % with regard to the total weight of the hole transport layer forming material. When forming a hole transport layer, if the dopant is added, the light emitting color can be adjusted according to the kind and content of the dopant, and by improving thermal stability of the hole transport layer, the lifespan of the element can be improved.

Further, the hole injection layer can be formed using a starburst amine-based compound, and the thickness of the hole injection layer can be formed in a range of about 30 to about 100 nm. When the hole injection layer deviates from the described thickness range, the hole injection characteristic is poor. Contact resistance between a counter electrode and a hole transport layer is reduced through the hole injection layer and hole transport ability of an anode electrode is improved, and thus an effect in which characteristics of the element are generally improved can be obtained.

The forming material for an emission layer according to aspects of the present invention is not particularly limited, and may include, for example, 4,4'-bis(carbazol-9-yl)-biphenyl (CBP). The emission layer according to aspects of the present invention may further contain a dopant that can emit light for electron-hole coupling, as in a hole transport layer, and in this case, the kind and content of the dopant are similar to those of the hole transport layer, so the film thickness of the emission layer may be in a range of about 10 to about 40 nm.

An electron transport material forming the ETL may further contain a dopant that can emit light for electron-hole coupling using tris(8-quinolinolato)-aluminum (Alq 3), as in the ETL. In this case, the kind and content of the dopant are similar to those of the hole transport layer, and the film thickness of the ETL may be in a range of about 30 to about 100 nm. When the ETL deviates from the thickness range efficiency deteriorates and the driving voltage rises.

A hole barrier layer (HBL) may be further formed between the emission layer and the ETL. Here, the hole barrier layer performs a function of preventing excitons that are formed in a phosphorescent material from moving to the ETL or preventing holes from moving to the ETL, and BAlq can be used as the hole barrier layer forming material.

The EIL can be formed with a material consisting of LiF, and the thickness thereof may be in a range of about 0.1 to about 10 nm. When the EIL deviates from the thickness range the driving voltage rises.

Next, by forming a counter electrode 192 at the whole surface of the substrate including the organic film layer 191, an OLED display according to this exemplary embodiment can be manufactured. In this case, the counter electrode 192 may be made of a material that is selected from a group consisting of Li, Ca, LiF/Ca, LiF/Al, Al, Mg, and alloys thereof.

FIGS. 7A through 7C are cross-sectional views illustrating a method of manufacturing a display device according to a another exemplary embodiment. The method of manufacturing a display device according to this exemplary embodiment is identical to the method of manufacturing a display device according to the previous exemplary embodiment, except for the following description.

First, referring to FIG. 7A, at the whole surface of a transparent insulation substrate 200 that is made of a material such as glass, quartz, and sapphire, a shock-absorbing layer 210 of a predetermined thickness is formed with silicon oxide ($SiO_x$) using a plasma-enhanced chemical vapor deposition (PECVD) method. Next, an amorphous silicon layer (not shown) of a predetermined thickness is deposited on the shock-absorbing layer 210, and the amorphous silicon layer is crystallized using a metal induced crystallization (MIC) method, a metal induced lateral crystallization (MILC) method, or a super grain silicon (SGS) method, i.e., a crystallization method using a metal catalyst, thereby forming a polysilicon layer (not shown).

Next, a gate insulating layer material layer (not shown) of a predetermined thickness is formed on the entire surface including the polysilicon layer. The gate insulating layer material is formed with silicon oxide ($SiO_x$), silicon nitride, or a stacked structure thereof.

Next, a gate electrode material layer (not shown) is formed on the gate insulating layer material layer (not shown). In this case, the gate electrode material is formed using amorphous silicon. The gate electrode material can be used by directly depositing doped amorphous silicon by performing a doping process while forming an amorphous silicon layer, but as described later, the doping can be performed by a doping process for injecting impurities into source/drain areas, and thus undoped amorphous silicon may be used at this stage of the process.

Next, the polysilicon layer (not shown), a gate insulating layer material layer (not shown), and a gate electrode material layer (not shown) are patterned by a photolithography process. This is identical to that of the previous exemplary embodiment and therefore a detailed description thereof will be omitted.

Next, by doping an n-type or p-type impurity on the whole surface of the substrate including the gate electrode and the capacitor upper electrode, source/drain areas 221a, 221c, 222a, and 222c and channel areas 221b and 222b are defined, thereby forming semiconductor layers 221 and 222. It is preferable that phosphorus (P) is used as the n-type impurity and boron (B) is used as the p-type impurity.

Thereby, a first polysilicon pattern 221', a first gate insulating layer 231, and a first gate electrode 241 are formed in the first area A, a second polysilicon pattern 222', a second gate insulating layer 232, and a first gate electrode 242 are formed in the second area B, and a capacitor lower electrode 223a, a dielectric layer 233, and a capacitor upper electrode 243 are formed in the third area C. Reference numeral 223b indicates a doped polysilicon layer pattern that extends from the capacitor lower electrode 223a to be connected to a pixel electrode.

Next, referring to FIG. 7B, an insulator film 250 is formed on the whole surface of the substrate including the gate electrodes 241 and 242 and the capacitor upper electrode 243, and a metal layer, a metal silicide layer, or a double layer 251 thereof is formed on the insulator film 250. Here, it is preferable that the metal layer, the metal silicide layer, or the double layer 251 thereof uses a metal layer including metals having a smaller diffusion coefficient than that of the metal catalyst for crystallization or alloys of the metals, or a metal silicide layer of the metals, within the semiconductor layers 221 and 222. The metal or metal silicide of the metal layer, the metal silicide layer, or the double layer 251 thereof is a gettering metal or metal silicide.

That is, in this exemplary embodiment, when a polysilicon layer is crystallized using an MIC method, an MILC method, or a super grain silicon (SGS) method using a crystallization guide metal, the polysilicon layer is used for gettering a crystallization guide metal remaining within the semiconductor layers 221 and 222. Thereafter, by performing a heat treatment process of the substrate, a crystallization guide metal can be gettered, and the gettering process is well known to a person of ordinary skill in the art and therefore a detailed description thereof will be omitted.

In this case, the heat treatment process is performed for a time period of about 30 seconds to about 10 hours in a temperature range of about 450° C. to about 900° C. When the heat treatment temperature is less than 450° C., it is difficult to fully remove the crystallization guide metal remaining in the semiconductor layers 221 and 222, and when the heat treatment temperature exceeds 900° C., the substrate may be deformed due to the high temperature. Further, when the heat treatment time period is less than 30 seconds, it is difficult to fully remove the crystallization guide metal remaining in the semiconductor layer, and when the heat treatment time period exceeds 10 hours, deformation of the substrate due to heat treatment for a long time period, a problem of high production cost, and a lower yield rate of thin film transistors may occur. Because the doped impurities are activated by the heat treatment process, a separate heat treatment process for activating the doped impurities may be omitted.

Next, referring to FIG. 7C, the gettering insulator layer 250 and the metal layer, the metal silicide layer, or the double layer 251 thereof are removed, and a substrate 200 including gate electrodes 241 and 242 and a capacitor upper electrode 243 according to this exemplary embodiment can be formed. The following processes are identical to processes (processes after FIG. 2A) of the previous exemplary embodiment and thus will be omitted, and therefore a display device according to this exemplary embodiment can be manufactured.

FIGS. 8A through 8F are cross-sectional views illustrating a method of manufacturing a display device according to another exemplary embodiment. The method of manufacturing a display device according to this exemplary embodiment is identical to the method of manufacturing a display device according to the previous exemplary embodiments, except for the following description.

First, referring to FIG. 8A, a shock-absorbing layer 310 of a predetermined thickness is formed with silicon oxide ($SiO_x$) at a whole surface of a transparent insulation substrate 300 made of a material such as glass, quartz, and sapphire using a plasma-enhanced chemical vapor deposition (PECVD) method. Next, an amorphous silicon layer (not shown) of a predetermined thickness is deposited on the shock-absorbing layer 310, and the amorphous silicon layer is crystallized using a metal induced crystallization (MIC) method, a metal induced lateral crystallization (MILL) method, or a super grain silicon (SGS) method, i.e., a crystallization method using a metal catalyst, thereby forming a polysilicon layer 320.

Next, a gate insulating layer material layer 330 of a predetermined thickness is formed on the entire surface of the polysilicon layer 320. The gate insulating layer material 330 can be formed with silicon oxide ($SiO_x$), silicon nitride, or a stacked structure thereof.

Next, a gate electrode material layer 340 is formed on the gate insulating layer material layer 330. In this case, the gate electrode material is formed using amorphous silicon. The gate electrode material directly deposits doped amorphous silicon by performing a doping process while forming an amorphous silicon layer.

Figure 8B:
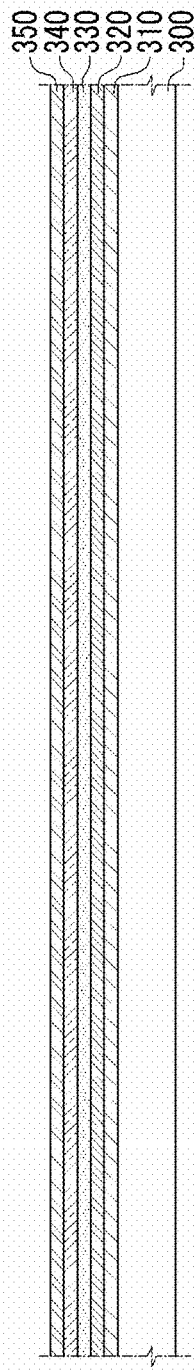

Next, referring to FIG. 8B, a dummy gate material layer 350 is formed on the gate electrode material layer 330.

Next, referring to FIG. 8C, the polysilicon layer 320, the gate insulating material layer 330, the gate electrode material layer 340, and the dummy gate material layer 350 are patterned by a photolithography process. This is identical to the previous exemplary embodiments, and hereafter a detailed description thereof will be omitted. However, in this exemplary embodiment, as described above, a dummy gate material layer 350 is included, and therefore, by patterning, dummy gate patterns 351, 352, and 353 are formed on gate electrodes 341 and 342 and a capacitor upper electrode 343.

Figure 8D:
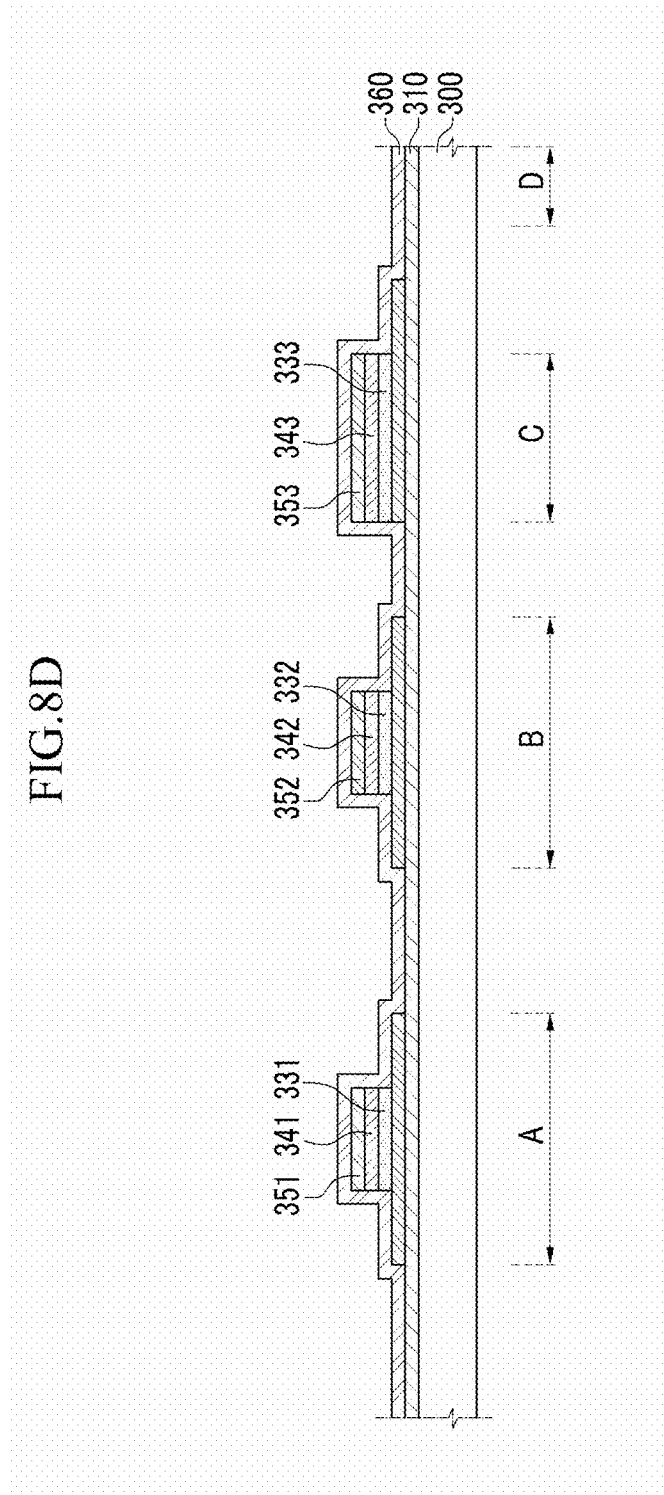

Next, referring to FIG. 8D, an Al layer 360 is formed on the whole surface of the substrate including the dummy gate patterns 351, 352, and 353. As described later, the Al layer 360 is a layer for forming source/drain areas (321a, 321c, 322a, 322c, see FIG. 8E).

Figure 8E:
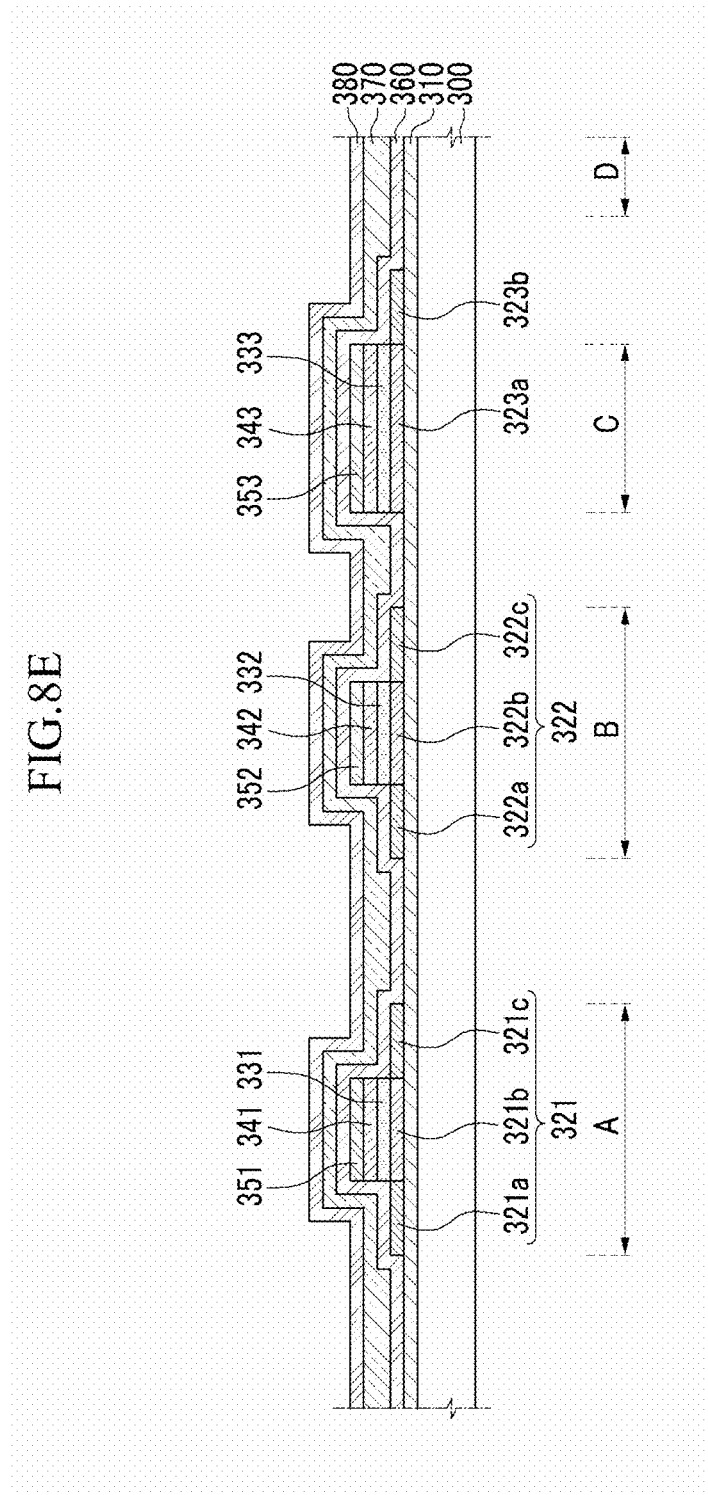
Figure 8F:
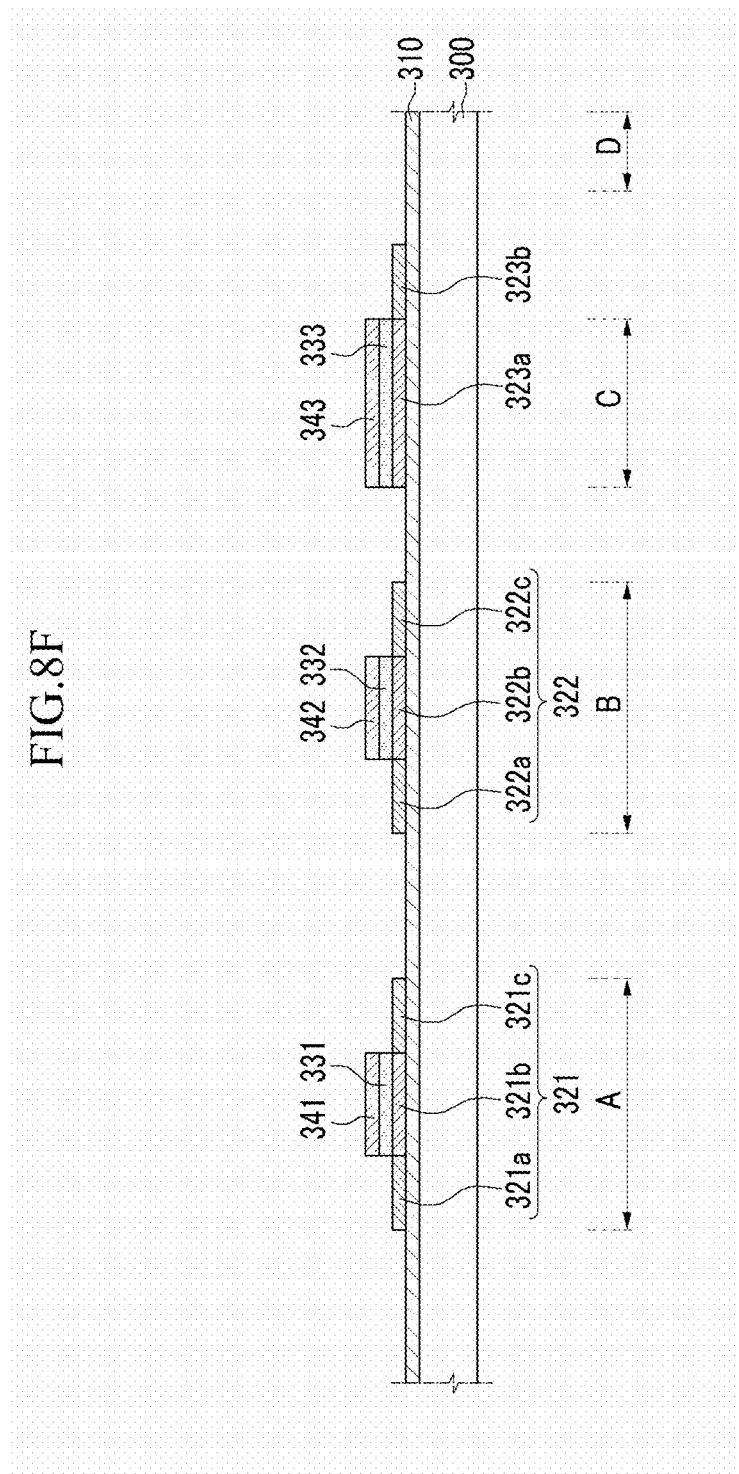

Next, referring to FIG. 8E, an insulator film 370 is formed on the Al layer 360, and a metal layer, a metal silicide layer, or a double layer 380 thereof is formed on the insulator film 370. When the insulator film 370 and the metal layer, metal silicide layer, or double layer 380 thereof are crystallized using an MIC method, an MILC method, or a super grain silicon (SGS) method in which a polysilicon semiconductor layer uses a crystallization guide metal, the insulator film 370 and the metal layer, metal silicide layer, or double layer 380 thereof are used for gettering a crystallization guide metal remaining within the semiconductor layer, as in the previous exemplary embodiments, and therefore a detailed description thereof will be omitted.

Thereafter, by performing a heat treatment process of the transparent insulation substrate 300, a crystallization guide metal can be gettered, and the heat treatment process is performed for a time period of about 30 seconds to about 10 hours in a temperature range of about 450° C. to about 900° C. In this exemplary embodiment, Al of the Al layer 360 is diffused into a polycrystal silicon layer by the heat treatment, thereby forming source/drain areas 321a, 321c, 322a and 322c. That is, Al is diffused into a polysilicon layer to form an Al—Si solid solution, and the Al—Si solid solution performs an acceptor function, and thus source/drain areas 321a, 321c, 322a and 322c according to this exemplary embodiment have an effect in which a P-type impurity is doped.

That is, by the heat treatment process, semiconductor layers 321 and 322 are formed by defining each of source/drain areas 321a, 321c, 322a, and 322c and channel areas 321b and 322b, and in this case, when Al is diffused, diffusion into the channel areas 321b and 322b is intercepted by a dummy gate pattern and thus the channel areas 321b and 322b correspond to an intrinsic area. Thereby, a first polysilicon pattern 321, a first gate insulating layer 331, and a first gate electrode 341 are formed in the first area, a second polysilicon pattern 322, a second gate insulating layer 332, and a first gate electrode 342 are formed in the second area B, and a capacitor lower electrode 323a, a dielectric layer 333, and a capacitor upper electrode 343 are formed in the third area C.

Reference numeral 323b indicates a doped polysilicon pattern that extends from the capacitor lower electrode 323a to be connected to a pixel electrode (not shown). The following processes are identical to the processes (processes after FIG. 2A) of the previous exemplary embodiments and thus will be omitted, and a display device according to this exemplary embodiment can be thus manufactured.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A display device comprising:
   a substrate that comprises a first area, a second area, and a third area;
   semiconductor layers that are formed on the first area and the second area of the substrate and that comprise in each area a channel area and source/drain areas;
   gate insulating layers that are formed on the semiconductor layers and that are formed in the areas corresponding to the channel areas;
   a gate electrode that is formed on each gate insulating layer;
   source/drain electrodes that directly contact the source/drain areas, respectively, of the semiconductor layers;
   a pixel electrode that is formed in the same layer as that of the source/drain electrodes and that is formed in the third area;
   an interlayer insulating layer that is formed on the whole surface of the substrate including the source/drain electrodes and the pixel electrode; and
   a gate line that is formed on the interlayer insulating layer and that is electrically connected to the gate electrode of the first area through a via contact hole of the interlayer insulating layer.

2. The display device of claim 1, wherein the source/drain electrodes are formed in a stacked structure of a transparent conductive layer and a metal layer.

3. The display device of claim 2, wherein:
the transparent conductive layer is made of any one material that is selected from a group consisting of indium tin oxide (ITO), indium zinc oxide (IZO), tin oxide (TO), and zinc oxide (ZnO),
the metal layer is made of one material that is selected from a group consisting of Mo, W, MoW, AlNd, Ti, Cu, a Cu alloy, Al, an Al alloy, Ag, and a Ag alloy, and
the metal layer is formed in a single layer, or a two-layered structure or a multi-layered structure of Mo, Cu, Al, or Ag.

4. The display device of claim 1, wherein the pixel electrode is formed with a transparent conductive layer.

5. The display device of claim 4, wherein the transparent conductive layer is made of any one material that is selected from a group consisting of indium tin oxide (ITO), indium zinc oxide (IZO), tin oxide (TO), and zinc oxide (ZnO).

6. The display device of claim 1, wherein the gate electrode is formed with a doped amorphous silicon layer or a doped polysilicon layer.

7. The display device of claim 1, further comprising a first connection wire that is formed on the interlayer insulating layer and that is electrically connected to the gate electrode of the first area through a via contact hole of the interlayer insulating layer.

8. The display device of claim 1, further comprising a data line and a power supply line that are formed in the same layer as that of the source/drain electrodes.

9. The display device of claim 1, further comprising a second connection wire that is electrically connected to a drain electrode of the first area, a third connection wire that is electrically connected to a gate electrode of the second area, and a fourth connection wire that is electrically connected to a drain electrode of the second area, wherein each connection wire is formed on the interlayer insulating layer.

10. The display device of claim 9, wherein the second connection wire and the third connection wire are electrically connected.

11. The display device of claim 9, wherein the fourth connection wire and the pixel electrode are electrically connected.

* * * * *